United States Patent [19]
Sei et al.

[11] Patent Number: 5,796,299
[45] Date of Patent: Aug. 18, 1998

[54] INTEGRATED CIRCUIT ARRAY INCLUDING I/O CELLS AND POWER SUPPLY CELLS

[75] Inventors: Toshikazu Sei, Kanagawa; Tomohiro Fujisaki, Tokyo, both of Japan

[73] Assignee: Kabushiki Kaisha Toshiba, Kawasaki, Japan

[21] Appl. No.: 759,703

[22] Filed: Dec. 6, 1996

[30]     Foreign Application Priority Data

Dec. 11, 1995  [JP]  Japan .................................. 7-321671

[51] Int. Cl.$^6$ ............................................. H01L 25/00
[52] U.S. Cl. ........................................ 327/565; 327/564
[58] Field of Search ............................ 326/39, 41, 47, 326/80, 81, 101; 327/319, 333, 564, 565, 566

[56]          References Cited
         FOREIGN PATENT DOCUMENTS 3-129828  6/1991  Japan .
3-263854  11/1991  Japan .

*Primary Examiner*—Timothy P. Callahan
*Assistant Examiner*—Jeffrey Zweizig
*Attorney, Agent, or Firm*—Foley & Lardner

[57]          ABSTRACT

There is provided a semiconductor integrated circuit having peripheral cell array including I/O cells and power supply cells, the cell array comprising first type cells having second level wiring layers consisting of a reference power supply (GND) wiring and a first power supply wiring, and second type cells having the second level wiring layers consisting of the reference power supply wiring, first and second power supply wirings. The second type cells are arranged in a predetermined area collectively and first and/or second power supply voltage are supplied to predetermined cells, through the second level wiring layers.

19 Claims, 7 Drawing Sheets

INTEGRATED CIRCUIT ARRAY INCLUDING I/O CELLS AND POWER SUPPLY CELLS

BACKGROUND OF THE INVENTION

1. Field of the Invention

The present invention relates a semiconductor integrated circuit which employs standard cell design methodology or gate array design methodology, having peripheral cell array operating with two different high level supply voltages and, more particularly, to a semiconductor integrated circuit in which voltage signals having different voltage level from those of operating voltages for internal circuits of the semiconductor integrated circuit are required to interface with other semiconductor devices.

2. Description of the Prior Art

A semiconductor device consisting of a combination of a first semiconductor chip having a first logical level and a second semiconductor chip having a second logical level different from that of the first semiconductor chip will be considered. In other words, assume that internal circuits of the first semiconductor chip designed by the standard cell or gate array methodology are operated with the 5 V power supply voltage, for example (it is assumed that the power supply voltage on the lower level (0 V) may be omitted if the expression "operated with the power supply voltage of 3 V or 5 V" is used hereinafter). Where a signal around 0 V is set to a logical level L (low) and a signal around 5 V is set to a logical level H (high). If the first semiconductor chip outputs the H level of 5 V to a second semiconductor chip which includes internal circuits using a voltage of 3 V as the power supply, for example (where a signal around 0 V is set to an L level and a signal around 3 V is set to an H level), the output signal sometimes exceeds a maximum voltage which is applicable to the second semiconductor chip using the 3 V power supply. Therefore, the H level of 5 V must be converted into the H level of 3 V in any manner.

In addition, to suppress a malfunction caused by superposition of noises on the signal output from the second semiconductor chip, operated with the 3 V supply voltage and using the signal around 0 V as the L level and the signal around 3 V as the H level, to the first semiconductor chip, there is necessity of improving noise immunity by increasing the output logical level to around 5 V. In this case, it is necessary for the second semiconductor chip to output the H level as the signal around 5 V. In this fashion, as an approach for converting the logical level of signal, there is a method wherein special level converters for converting the voltage levels are provided on the circuit board to which the semiconductor chip is mounted so as to operate the semiconductor chip per se by a single power supply.

If the converter circuits such as the level converters are integrated on the semiconductor chip, the circuit board can be miniaturized. By way of example, as structures of the converter circuits for converting the logical level of signal, I/O cells made of the circuits shown in FIGS. 1A to 1E and FIGS. 2A to 2D can be used. FIGS. 1A to 1E show structures of I/O cells for interconnecting between the internal circuits on the semiconductor chip operated with power supply voltages of 3 V and external circuits or devices. An I/O cell shown in FIG. 1A is an output buffer which outputs the high level signal from the internal circuits as the 3 V signal, by using the 3 V power supply voltage same as that of the internal circuits. An I/O cell shown in FIG. 1B is an output buffer which outputs the high level signal of 5 V, after converting the 3 V high level signal supplied from the internal circuits to a 5 V high level signal, by using the 5 V power supply voltage equal to the high level output. An I/O cell shown in FIG. 1C is an input buffer which transmits the 3 V high level signal given from the external devices as the 3 V high level input signal to the internal circuits, by using the 3 V power supply voltage equal to that of the internal circuits. An I/O cell shown in FIG. 1D is an input buffer which inputs the 3 V high level signal to the internal circuits, after converting the 5 V high level signal supplied from the external devices into the 3 V high level signal, by using two different power supply voltages of 3 V and 5 V. An I/O cell shown in FIG. 1E is an input buffer which inputs the 3 V high level signal to the internal circuits, after converting the 5 V high level signal given from the external devices into the 3 V high level signal, by using the 3 V power supply voltage equal to that of the internal circuits.

FIGS. 2A to 2D are schematic circuit diagrams showing circuit structures of I/O cells for interfacing the internal circuits in the semiconductor chip operated with power supply voltages of 5 V and the external devices. An I/O cell shown in FIG. 2A is an output buffer which outputs the 5 V high level signal, transferring 5 V high level signal from the internal circuits, by using the 5 V power supply voltage identical to that of the internal circuits. An I/O cell shown in FIG. 2B is an output buffer which outputs the 3 V high level signal, after converting the 5 V high level signal supplied from the internal circuits into the 3 V high level signal, by using two different power supply voltages of 3 V and 5 V. An I/O cell shown in FIG. 2C is an input buffer which inputs the 5 V high level signal to the internal circuits, after converting the 3 V high level signal given from the external devices into the 5 V high level signal or transferring the external 5 V high level signal, by using the 5 V power supply voltage identical to that of the internal circuits. An I/O cell shown in FIG. 2D is an input buffer which inputs the 5 V high level signal to the internal circuits, after converting the 3 V high level signal supplied from the external devices into the 5 V high level signal, by using two different power supply voltages of 3 V and 5 V.

In the prior art, with the use of the pattern layout shown in FIG. 3, the power supply voltages have been supplied to the I/O cells shown in FIGS. 1A to 1E and FIGS. 2A to 2D. In the pattern layout shown in FIG. 3, assume that the internal circuits are operated with the 3 V power supply voltage, for example, and the output buffers are equipped with an output terminal to output the 3 V high level signal and an output terminal to output the 5 V high level signal. All the I/O cells 100 equipped with first level wiring layers have three power supply wirings 101G, 101H, 101L for supplying 0 V (GND), 5 V, 3 V which are formed as second level wiring layers on the first level wiring layers. An insulating film is formed between the first and second level wiring layers. Respective power supply wirings 101G, 101H, 101L on each I/O cells are connected side by side to the same kinds of power supply wirings on adjacent I/O cells 100. On a peripheral region of the semiconductor chip 102, a cell array which consists of a plurality of I/O cells 100 and power supply cells 103G, 103H, 103L for supplying power supply voltages from the external devices to respective power supply wirings is arranged. The power supply wirings 101G, 101H, 101L, formed as the second level wiring layers, are provided from end to end on the cell array without disconnection. Power supply voltages, which are given from the external devices to respective bonding pads 104, are supplied to respective I/O cells 100 via the power supply cells 103G, 103H, 103L and the power supply wirings 101G, 101H, 101L. In other words, the power supply voltages are supplied to respective I/O cells via the power supply wiring 101G connected to the GND power supply cell 103G, via the power supply wiring 101H connected to the 5 V power supply cell 103H, and via the power supply wiring 101L connected to the 3 V power supply cell 103L.

If differences in pattern shapes and positions are caused on the connection portions between adjacent I/O cells 100, width of the wiring on one of the I/O cells at concerned portion must be narrowed. And the power supply wirings 101G, 101H, 101L formed as the second level wiring layers have narrowed portions. For this reason, even if other portions of the power supply wirings 101G, 101H, 101L are formed to be wide, current handling capability is limited at the concerned portions (stepped portions), so that the current which can be supplied from the power supply cell 103 to the I/O cell 100 is reduced. In order to avoid this situation, locations and widths of the I/O cells 100 and the power supply cells 103G, 103H, 103L, arranged on the peripheral region of the semiconductor chip 102, are made uniform.

More particularly, in the standard cell or gate array design method, respective cell patterns are not designed each time by user's request, but are formed in advance and stored in CAD computer, thereby designing various LSI pattern using the stored cell data. The second level wiring layers for all the I/O cells are made uniform in width and location relative to the column direction of the I/O cells, which are arranged on the peripheral region of the semiconductor chip 3. And the power supply wirings, which are newly designed by user's request formed as the second level wiring layers, are not disconnected, nor is the current handling capability reduced by the generation of the stepped position, even when arbitrary kinds of I/O cells are arranged at arbitrary locations in the column direction. In the prior art, according to the above design scheme, the handling capability for current flowing through the second level wiring layers has been assured.

The layout shown in FIG. 3 has three kinds of power supply wirings, i.e., the GND power supply wiring 101G, the 3 V power supply wiring 101L, and the 5 V power supply wiring 101H, all formed as the second level wiring layers on the I/O cell array including a plurality of I/O cells 100 each having first level wiring layers. However, in this layout strategy, widths of the 3 V power supply wiring 101L and the 5 V power supply wiring 101H are determined previously. Therefore, since the 5 V power supply wiring 101H is provided as the second level wiring layer even on the I/O cell array in which most of the cells do not use the 5 V power supply voltage, a space in the semiconductor chip is wasted.

In this case, if configurations of the I/O cells 100 are designed under the condition that type and location of the I/O cells 100 using the 5 V power supply voltage have been known in advance, the width of the power supply wiring as the second level wiring layer can be optimized in design based on the types and number thereof.

However, in the standard cell or gate array design method, the cells are not designed every time when new semiconductor chip is designed, but the databases for cells are registered as cell library. And LSI patterns are designed using the registered cell library, reducing the period for LSI designing. Thus even though kinds and locations of the cells have been known in a certain LSI pattern, the cells are not always optimized when they are used in other LSI pattern.

In other words, if the widths of the GND, 3 V, 5 V power supply wirings formed as the second level wiring layers are determined in accordance with the respective current dissipation of the 3 V and the 5 V power supplies in the I/O cells in certain chip design, width of the 3 V power supply wiring may become insufficient and width of the 5 V power supply wiring may become excessive in other chip design using the same I/O cells. In such a case, the 3 V power supply cell 103L must be added to supplement shortage.

In the event that the power supply cells 103H, 103L lack in current capacity while power supply wirings on the I/O cells 100 have enough current capacity, shortage of current capacity of the power supply cells can be supplemented by arranging new power supply cell in parallel with the low capacity cell since the power supply cells have few restrictions on arrangement. If doing this, the bonding pads of two adjacent identical power supply cells can be connected to the identical pin of the lead frame on which the semiconductor chip mounted, and wiring on the circuit board are connected to the bonding pad on semiconductor chip sealed in a package through the pin. Hence, the number of pins of the package is in no ways increased.

However, if capacity of the power supply cells is not called in question but the width of the 3 V power supply wiring 101L, for example, of the power supply wirings on the I/O cells is not enough, the new power supply cells 103L must be added in other location. Although the situation that new cell must be added is same as above, to disperse the current flowing through the power supply wiring 101L on the I/O cells, not to concentrate current in excess of allowable current density, the power supply cells 103L must be arranged at a sufficient distance mutually. In this case, since added power supply cells 103L cannot be arranged adjacently, the power supply cells cannot be connected to same pin of the lead frame, so that one dedicated pin for the added power supply cells 103L has to be added. In this event, no problem arises if the package has extra pins and the lead frame leaves a margin, but the package must be exchanged into another package with more pins if the package has no extra pin. Or, the number of usable signal has to be reduced and the reduced pins must be allocated to the added power supply.

In contrast, if the width of the GND, 3 V, 5 V power supply wirings 101G, 101L, 101H are widened not to cause the above situation, the size or height of the I/O cells must be increased in I/O cell design to thus cause increase in the chip size.

For example, there are inventions set forth in Patent Application Publication (KOKAI) 3-263854 or Patent Application Publication (KOKAI) 3-129828 as the prior art concerning semiconductor device having the power supply wirings designed by standard cell layout or gate array methodology. In Patent Application Publication (KOKAI) 3-263854, an LSI having first power supply lines formed in parallel to individual basic cells of the internal circuits and second power supply lines formed in perpendicular to the first power supply lines is disclosed. And such an invention has been set forth that, by providing portions of a wide wiring width to a part or all of plural first power supply lines, the maximum operating frequency is increased, the power dissipation of the power supply blocks is averaged, and the current supplying capability is increased, without reduction in reliability. In Patent Application Publication (KOKAI) 3-129828, an integrated circuit having power supply wirings along x and y directions forming network structure is disclosed. And such an invention has been set forth that, by arranging the power supply wirings while changing a wiring pitch of the network structure or a wiring width, local concentration of the current can be eased and thus a wiring width of the contour power supply wiring around a macrocell including functional block can be narrowed.

With the above, in the conventional semiconductor device using two different high level supply voltages, designed by standard cell or gate array method, if a wiring width of the power supply wiring is narrow rather than required operating current, current concentration in the power supply wirings will occur. And the current concentration must be avoided by arranging power supply cells between the I/O cell array in a dispersed manner. However, in such a case, the number of pins to be connected to the power supply cells has been increased to thus result in increase in size of the package. On the contrary, if a wiring width of the power supply wirings is widened to avoid such disadvantages, the I/O cell and the power supply cell have been increased in size (height) with the increase in the wiring width of the power supply wirings, so that the structure of the semiconductor device as a whole has been increased in size.

SUMMARY OF THE INVENTION

The present invention has been made in the light of the above problems, and an object of the present invention is to provide a semiconductor device having peripheral cell array operating with two different high level supply voltages, preventing an increase in size of I/O cells, to suppress an increase in the number of power supply pins, and to attain miniaturization of the chip size.

In order to achieve the above object, as shown in FIG. 4, the present invention has a cell array comprising first type cells V1G, O1L, V1L having a reference power supply wiring 1G for supplying a reference voltage (GND) and a first power supply wiring 1L for supplying a first power supply voltage (e.g., 3 V) as second level wiring layers, and second type cells O2H, I2H, I2L, V2H having the reference power supply wiring 1G, the first power supply wiring 1L, and a second power supply wiring 1H for supplying a second power supply voltage (e.g., 5 V) as the second level wiring layers. Further, as shown in FIG. 5, the present invention is characterized by a semiconductor integrated circuit which can be automatically designed by standard cell or gate array methodology, and the cell array consisting of the first type cells V1G, O1L, V1L and the second type cells O2H, I2H, I2L, V2H is arranged on a peripheral region of a semiconductor chip 3. It is a matter of great significance that, as shown in FIG. 4, the second type cells O2H, I2H, I2L, V2H are arranged in a certain location collectively. As shown in FIG. 4, by forming a predetermined portion of the first power supply wiring 1L as a narrow lane to generate a vacant space and arranging the second power supply wiring 1H to fill the vacant space, electrically isolated with the first power supply wiring 1L, the first power supply voltage and/or the second power supply voltage can be supplied to predetermined I/O cells or power supply cells without increase in size of the cell. In addition, it is feasible to supply two kinds of power supply voltages to predetermined cells without increase in the pin number of the package. According to the present invention, since two kinds of the second level wiring layer configurations, i.e., first and second type, are prepared for a part of I/O cells having identical function, appropriate second level wiring layer profile can be selected according to the kind of adjacent cell. Therefore, restrictions on usable locations in conventional arrangement of the cells can be relaxed, and therefore margin of arrangement of the I/O cells can be improved.

In addition, as shown in FIG. 7, if a cell array is made up of fourth type cells 17 having at least one reference power supply wiring, at least one first power supply wiring, and at least two second power supply wiring 1H$a$, 1H$b$ (having wide and narrow wiring widths) as the second level wiring layer and third type cells 18 without having the wide second power supply wiring 1H$a$ as the second level wiring layer, limitation on the cell arrangement can be eased. The third and fourth type cells can be interpreted as more developed forms of the second type cell. This is because output transistors at the final stage in the output buffer, which need a large current, can be connected to the wide second power supply wiring 1H$a$ by making use of the fourth type cells. And I/O cells having the function of the first and second type cells discussed above can be provided equivalently to the third type cells, except for such output transistors, by making use of the narrow second power supply wiring 1H$b$. As a result the arrangement of the first and second type cells is designed freely and these cells can be used properly.

As a matter of fact, the first and second power supply voltages are not limited to be 3 and 5 V. Any other combination of voltages such as 2.5 V and 3 V, 1.5 V and 3 V, or 1.5 V and 2.5 V may be employed for the first and second power supply voltages in this invention.

Other and future objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1A:
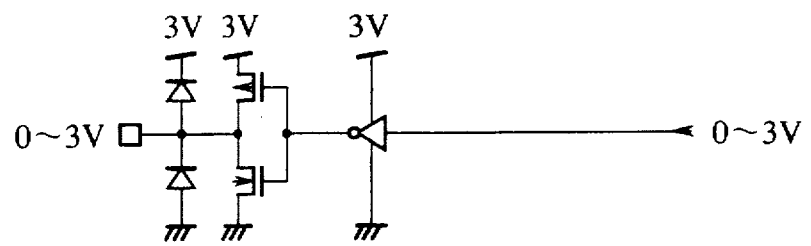
FIGS. 1A to 1E are schematic circuit diagrams showing particular circuit structures of I/O cells arranged on a peripheral region of a semiconductor chip in the conventional semiconductor integrated circuit respectively.
Figure 1B:
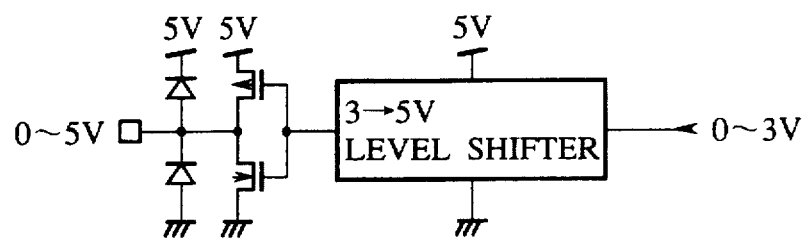
Figure 1C:
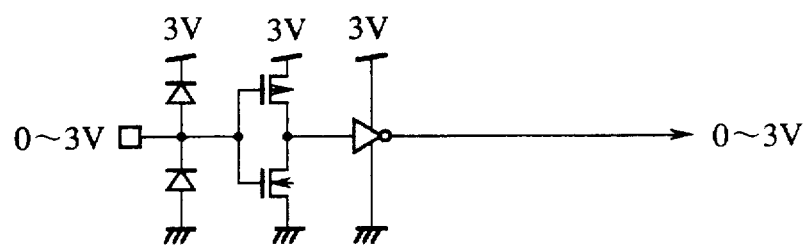
Figure 1D:
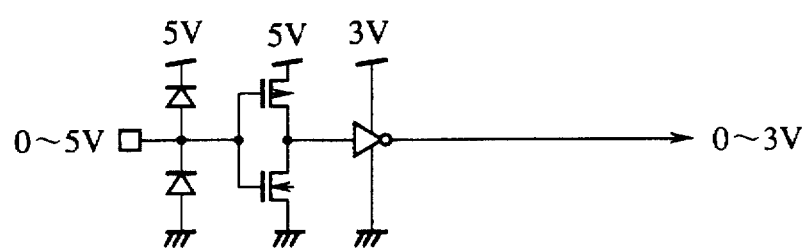
Figure 1E:
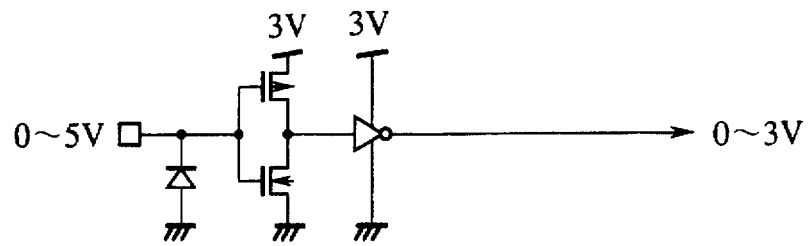
Figure 2A:
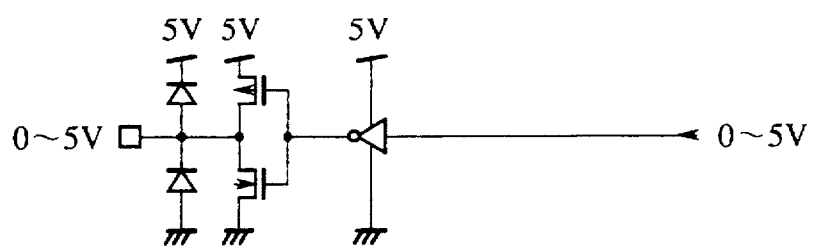
FIGS. 2A to 2D are schematic circuit diagrams showing particular circuit structures of I/O cells arranged on the peripheral region of the semiconductor chip in the conventional semiconductor integrated circuit respectively.
Figure 2B:
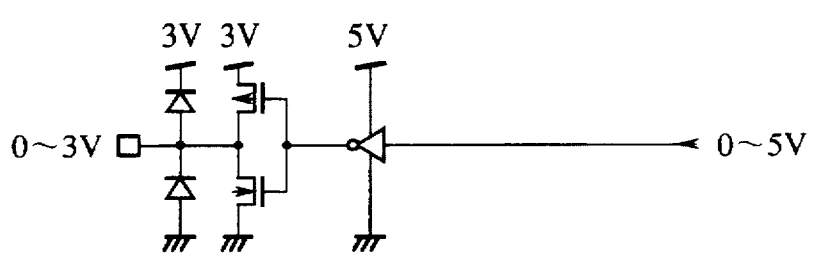
Figure 2C:
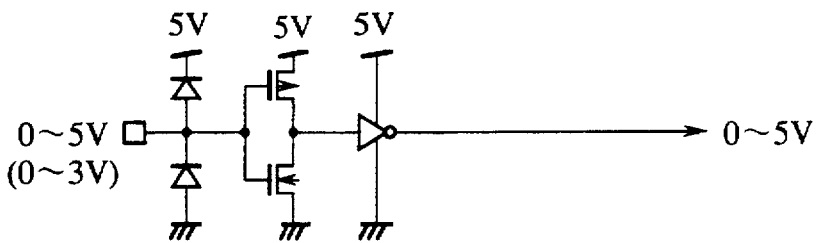
Figure 2D:
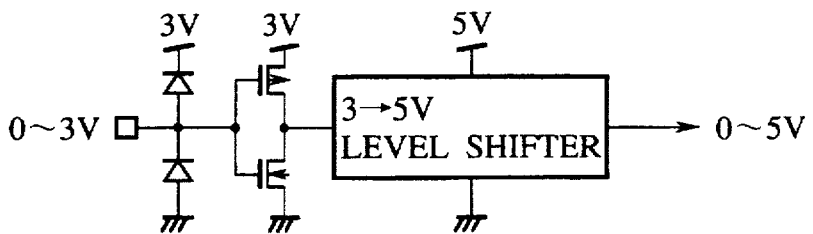

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 4:
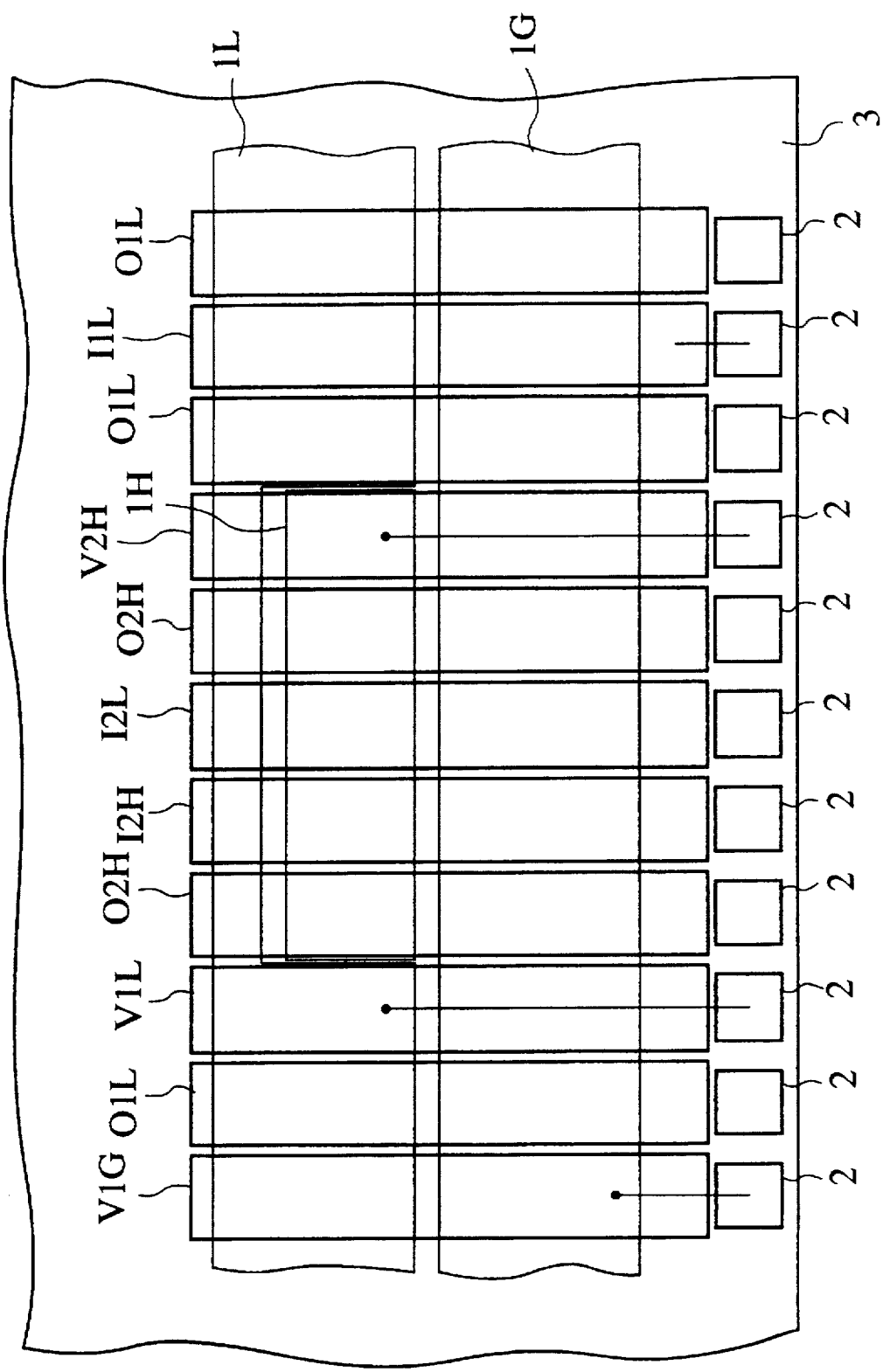
FIG. 4 is a plan view showing I/O cells, power supply cells, and power supply wirings arranged in a semiconductor integrated circuit according to a first embodiment of the present invention.
Figure 5:
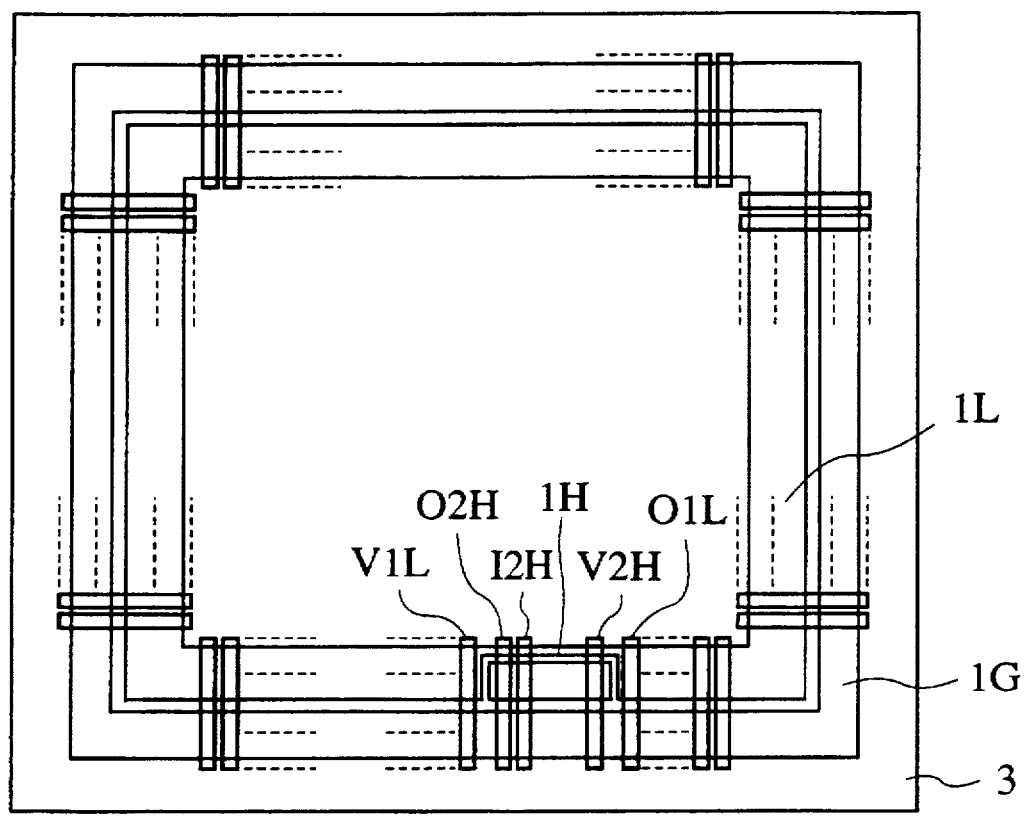
FIG. 5 is a plan view showing an overall structure of a semiconductor chip for the semiconductor integrated circuit according to the first embodiment of the present invention.

FIG. 4 is a plan view showing a structure on a peripheral region of a semiconductor chip 3, on which a semiconductor integrated circuit is formed, according to a first embodiment of the present invention. FIG. 5 is a plan view showing an overall structure of the semiconductor chip 3 shown in FIG. 4. The semiconductor integrated circuit according to the first embodiment of the present invention comprises internal circuits operated with a reference voltage (ground potential, GND) and a first power supply voltage, e.g., 3 V, in a central region of the semiconductor chip 3 shown in FIG. 5. As shown in FIG. 4, on a peripheral region of the semiconductor chip 3 is arranged a cell array including I/O cells arranged to interface the internal circuits and external devices. For example, the I/O cells convert a signal level from 3 V to 5 V and vice versa. Further, the cell array comprises power supply cells arranged adjacently to the I/O cells to supply external power supply voltages to the I/O cells. Respective I/O cells and power supply cells have predetermined height and width, and are wired by first level wiring layers. Second level wiring layers are formed on the first level wiring layers via an interlayer insulating film. More specifically, a GND wiring 1G for supplying the GND voltage and a first power supply wiring 1L for supplying a first power supply voltage (3 V) are formed on the cell array as the second level wiring layers. A part of the first power supply wiring 1L is formed to be narrowed generating a vacant space, and a second power supply wiring 1H for supplying a second power supply voltage (5 V) is formed, as the second level wiring layer, to fill the vacant space at the narrowed part of the first power supply wiring 1L, electrically isolated with the first power supply wiring 1L.

In FIG. 4, terminology "I" denotes an I/O cell serving as an input buffer, "O", an I/O cell serving as an output buffer, and "V", a power supply cell. In addition, assume that terminology "1" indicates a first type cell, "2", a second type cell, "L", to use or receive a first power supply voltage, and "H", to use first and second power supply voltage in the I/O cells and to receive the second power supply voltage in the power supply cells. Where "first type" is such a cell type that has a reference power supply wiring 1G for supplying the reference (GND) voltage and a first power supply wiring 1L for supplying a first power supply voltage (3 V) as a second level wiring layer on the upper part of the cell. And "second type" is such a cell type that has the reference power supply wiring 1G for supplying the GND voltage, the first power supply wiring 1L for supplying a first power supply voltage (3 V), and a second power supply wiring 1H for supplying a second power supply voltage (5 V) as the second level wiring layer on the upper part of the cell.

An I/O cell array shown in FIG. 4 comprises a first type input buffer I1L operated with the GND voltage and the first power supply voltage, a second type first input buffer I2L operated with the GND voltage and the first power supply voltage, a second type second input buffer I2H operated with the GND voltage, the first power supply voltage and the second power supply voltage, first type output buffers O1L operated with the GND voltage and the first power supply voltage, and second type output buffers O2H operated with the GND voltage, the first power supply voltage, and the second power supply voltage.

Power supply cells shown in FIG. 4 comprises a first type reference power supply cell V1G which receives the GND voltage, a second type reference power supply cell V2G (not shown) which receives the GND voltage, a first type power supply cell V1L which receives the first power supply voltage, a second type first power supply cell V2L (not shown) which receives the first power supply voltage, and a second type second power supply cell V2H which receives the second power supply voltage.

As shown in FIG. 4, respective I/O cells and power supply cells are aligned along the periphery of the semiconductor chip 3 to input/output signals from/to external devices and also receive supply of power supply voltages via bonding pads 2 which are arranged on the further outer side of the cell array. Each I/O cell or power supply cell has a predetermined height and width to form a rectangular shape. Then power supply wirings 1G, 1L, 1H which supply respectively specified power supply voltages to adjacent I/O cells or power supply cells are connected as shown in FIG. 4. In other words, the GND wiring 1G and the first power supply wiring 1L are connected to respective adjacent I/O cells or power supply cells. Still further, the second power supply wiring 1H is connected to predetermined I/O cells and power supply cells. As shown in FIG. 4, respective power supply wirings are formed on the cell array in which cells are aligned on a straight line to have a uniform height. The second level wiring layers on the respective cells, having a uniform location and width, are electrically connected with each other. Power supply voltages, which being supplied to the power supply cells via bonding pads 2, are supplied to the respective I/O cells, through the power supply wirings 1G, 1L, 1H.

In addition, as shown in FIG. 4, the second type input buffers I2L, I2H, second type output buffer O2H, and second type power supply cell V2H are aligned successively as one block.

In particular, as the second level wiring layers, to the second type output buffer O2H which use the second power supply voltage not to be used in the internal circuits, the GND wiring 1G, the second power supply wiring 1H delivering the second power supply voltage, and the first power supply wiring 1L delivering the first power supply voltage are provided. The first power supply voltage is also used in the internal circuits. To the first type output buffer O1L operated only with the first power supply voltage, without the second power supply voltage, the GND wiring 1G is provided as the second level wiring layer at the same location and to have the same width as those of the second type output buffer O2H. The first power supply wiring 1L of the output buffer O1L is provided at locations of the first power supply wiring 1L and the second power supply wiring 1H formed on the second type output buffer O2H.

Two types of I/O cells, i.e., the input buffer I2L having the same first and second power supply wirings as the second level wiring layer on the output buffer O2H, and the input buffer I1L having the same first power supply wiring as the second level wiring layer on the output buffer O1L, are provided respectively to the cell having identical function. Either of them can be used properly in compliance with particular locations where the two types of cells having identical function are to be installed. To the second type input buffer I2H operating with the first and second power supply voltage, the second level wiring layers which have the identical configuration with those of the second type output buffer O2H are provided.

Except for the power supply cell V2H to supply the second power supply voltage, two types of the power supply cells, i.e., power supply cells V2G, V2L (not shown) having the same second level wiring layer as the output buffer O2H and power supply cells V1G, V1L having the same second level wiring layer as the output buffer O1L are provided respectively to the cells having identical function. One of them should be used properly in accordance with certain locations where the identical function cell is to be installed. The power supply cell V2H for receiving and providing the second power supply voltage has the second type configuration in which the second power supply wiring 1H as the second level wiring layer is formed same as that of the output buffer O2H.

In this manner, two kinds of geometrical configurations for the second level wiring layer, i.e., first and second type profiles, are prepared for a part of I/O cells to execute identical function. Then an appropriate profile of the second level wiring layers would be selected according to the type of adjacent cells. Since these cells are hardly subject to restrictions on available arrangement locations, the margin of I/O cell arrangement can be improved. I/O cells having two types of the second level wiring layer profiles are limited to only the input buffers I1L, I2L operated with a single supply voltage (a first power supply voltage). Their current dissipation is small rather than the output buffer. Accordingly, even if power supply wirings for these I/O cells are narrowed, such a serious problem as in the output buffer is not caused.

The power supply cell V2H for delivering the second power supply voltage is under restrictions on arrangement. In other words, there is restrictions that, near the certain cells which use the second power supply voltage, the output buffer O1L of first type must not be formed between the power supply cell V2H and the certain cells. However, if the power supply cells are arranged near the I/O cells using the power supply, influence such as voltage drop due to resistance components of the wiring can be suppressed. Hence, it is not possible to say that the above restrictions are severe restrictions.

Figure 3:
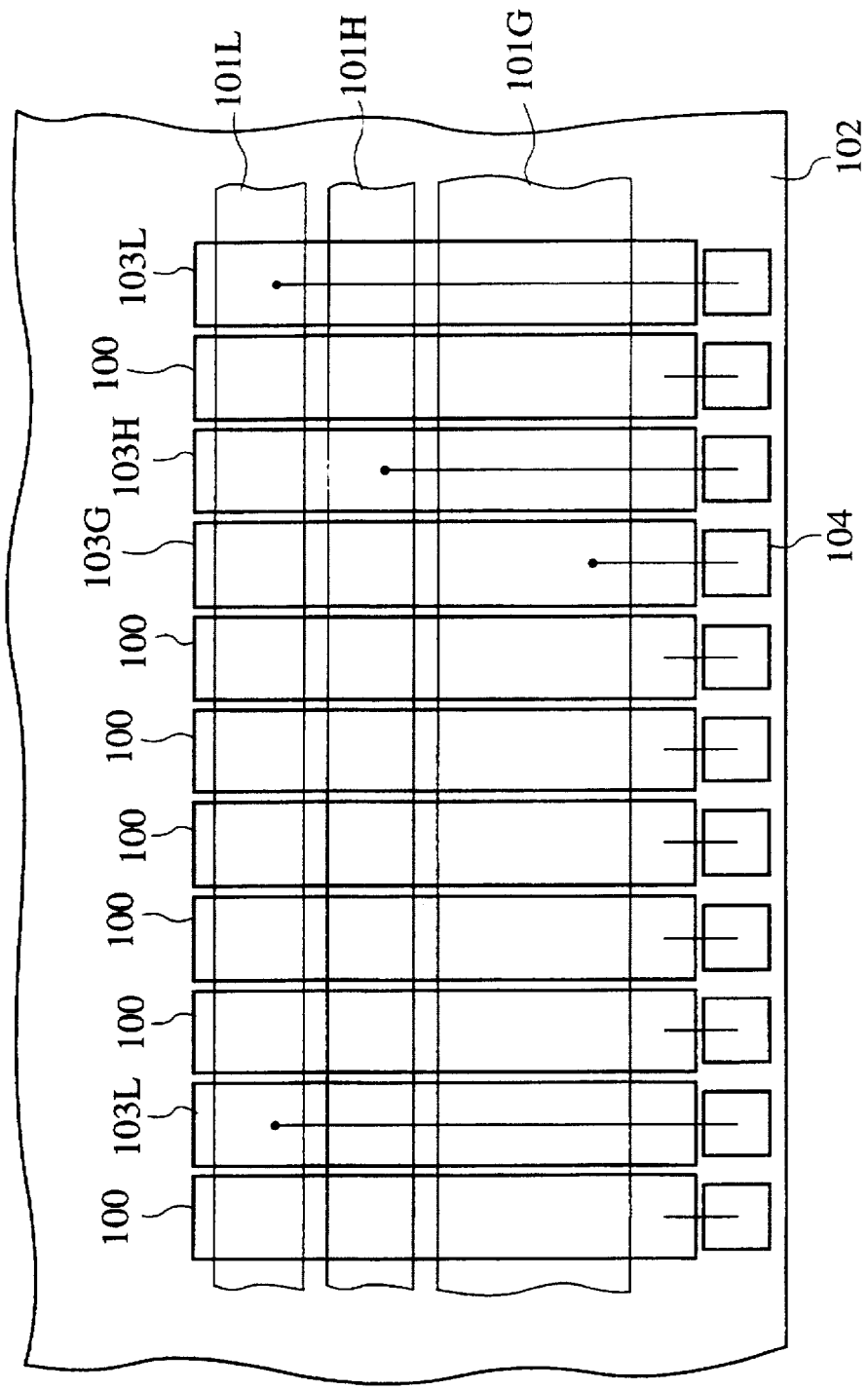
FIG. 3 is a plan view showing I/O cells, power supply cells, and power supply wirings arranged on the peripheral region of the conventional semiconductor chip.

For the output buffer O2H using the first and second power supply voltages, the first power supply wiring 1L is narrow but the second power supply wiring 1H is wide. For the output buffer O1L not using the second power supply voltage, the first power supply wiring 1L is wide and no second power supply wiring 1H is provided. As a result, according to the above method, current can be supplied to the output buffer via the wide power supply wiring without increase in size of the I/O cells rather than the conventional structure shown in FIG. 3 even though the output buffer needs a large current.

Further, the input buffer I2L, sandwiched in between two second type buffers I2H, O2H, Is a second type I/O cell which does not use the second power supply voltage. Since the input buffer I2L has the wide second power supply wiring 1H for supplying the second power supply voltage, the first power supply wiring 1L has become narrow. However, in contrast to the output buffer, current dissipation is small in the input buffer. Hence, deficiency in the current capacity of the first power supply wiring 1L is difficult to take place in the input buffer I2L.

The above discussion becomes evident from the allover structure of the semiconductor chip 3 having the cell array shown in FIG. 5. As shown in FIG. 5, the first embodiment of the present invention is particularly advantageous to such a case that a rate of the second type output buffer O2H to the first type output buffer O1L is extremely small.

As has been explained earlier, in the first embodiment of the present invention, both the second type cells, having the second power supply wiring for supplying the second power supply voltage which is not used in the internal circuits, and the first type cells not having the second power supply wiring are provided. In addition, the second type cells are arranged collectively. Therefore, according to the first embodiment of the present invention, the semiconductor device, which is excellent in current supplying capability, having I/O cells operating with two different high level supply voltages such as 3 V and 5 V, can be automatically designed and manufactured without increase in the size of the I/O cells and the pin number of the package.

(Second Embodiment)

Figure 6:
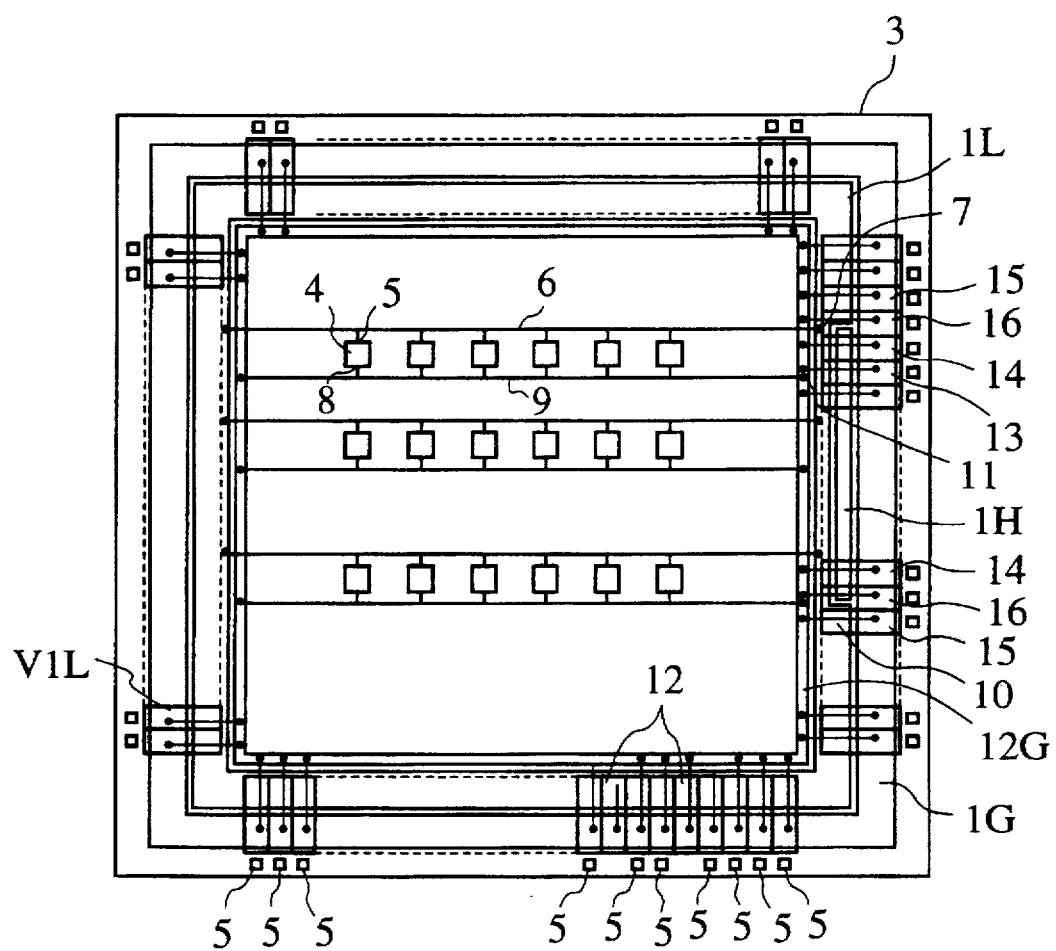
FIG. 6 is a plan view showing an overall structure of a semiconductor chip for a semiconductor integrated circuit according to a second embodiment of the present invention.

FIG. 6 is a plan view showing an overall structure of a semiconductor chip on which a semiconductor integrated circuit (LSI) is formed according to a second embodiment of the present invention. In the central region of the semiconductor chip 3, a plurality of internal circuits, each circuit 4 having a first and second terminals 5, 8 are disposed. In FIG. 6, the first terminals 5 of circuit cells 4 for internal circuits are electrically connected to internal power supply wirings 6. And the internal power supply wiring 6 is connected to the first power supply wiring 1L formed as the second level wiring layer provided on an I/O cell array. Wide wirings 1L are provided between connecting points 7, at which the internal power supply wirings 6 are connected to the first power supply wiring 1L, and power supply cells V1L. The power supply cell V1L illustrated at the left side of the semiconductor chip are the first type cell similar to those shown in FIG. 4 to supply the first power supply voltage.

The internal power supply wirings 6 are connected to the first power supply wiring 1L which is formed as the second level wiring layer for on the cell array comprising the first and second type cells explained in the first embodiment. Even when the circuit cells 4 for the internal circuits are to be arranged at such locations that the internal power supply wirings 6 are extracted to the second type cell side, the internal power supply wirings 6 can be directly connected to the first power supply wiring 1L having a wide width rather than the internal power supply wirings 6. Namely, the internal power supply wirings 6 can be connected to the first power supply wiring, at any location. Hence, it requires no additional internal power supply wiring detouring and connected between the internal power supply wirings 6 and the first power supply wiring 1L. For this reason, current capacity can be assured sufficiently between the connecting point 7 and the power supply cells V1L, so that wiring resistance can be reduced.

Still further, as shown in FIG. 6, in the second embodiment of the present invention, a second reference power supply wiring 12G is provided between the internal circuits and the cell array. The second terminals, or reference (GND) voltage terminals 8 are connected to internal reference wirings 9. And the internal reference wirings 9 are electrically connected to a second reference power supply wiring 12G surrounding the internal circuits 4. Still more, wirings 10 formed as the first level wiring layer are provided in the respective I/O cells to connect the second reference power supply wiring 12G with the reference power supply (GND) wiring (first reference power supply wiring) 1G.

Consequently, the wiring to be provided between the connecting points 11, at which the internal reference wirings 9 are connected to the second reference power supply wiring 12G, and the reference power supply cell V1G are dispersed between the second reference power supply wiring 12G and the first reference power supply wiring 1G. Therefore, current capacity therebetween can be secured so that wiring resistance can be reduced.

In addition, all the cells are arranged at a minimum distance in the I/O cell array, and the power supply wirings, having identical location and width as the second level wiring layer, are geometrically connected by themselves to come into contact with same kind power supply wirings of adjacent cells. And there is no need to newly design the second level layer on the I/O cells. Hence, in the automated design of LSI patterns, time and labor required for layouting the same kind power supply wirings formed as the second level wiring layer on the I/O cell array can be saved.

Meanwhile, as shown in FIG. 6, in order to automatically connect the power supply wirings formed as the second level wiring layer, first type intercell connection cells 12 and second type intercell connection cells 13 are provided at empty locations where neither I/O cell nor power supply cell is arranged in the I/O cell array. By disposing the dummy intercell connection cells 12, 13 adjacent to active cells the power supply wirings on adjacent cells as the second level wiring layer are geometrically connected by themselves, mating with the same kind power supply wirings side by side, time and labor required for layouting the same kind power supply wirings as the second level wiring layer on the I/O cell array can be saved, at the time of LSI design.

Furthermore, as shown in FIG. 6, if a boundary connection cell 16 is arranged on the boundary between the second type cell 14 and the first type cell 15 without having the second power supply wiring 1H, it can be avoided that the second power supply wiring 1H on the second type cell 14 is short-circuited to the first power supply wiring 1L on the first type cells 15, which have the wide first power supply wiring 1L on the cell boundary in place of the second power supply wiring 1H. The boundary connection cells 16 may be formed of the power supply cells.

(Third Embodiment)

Figure 7:
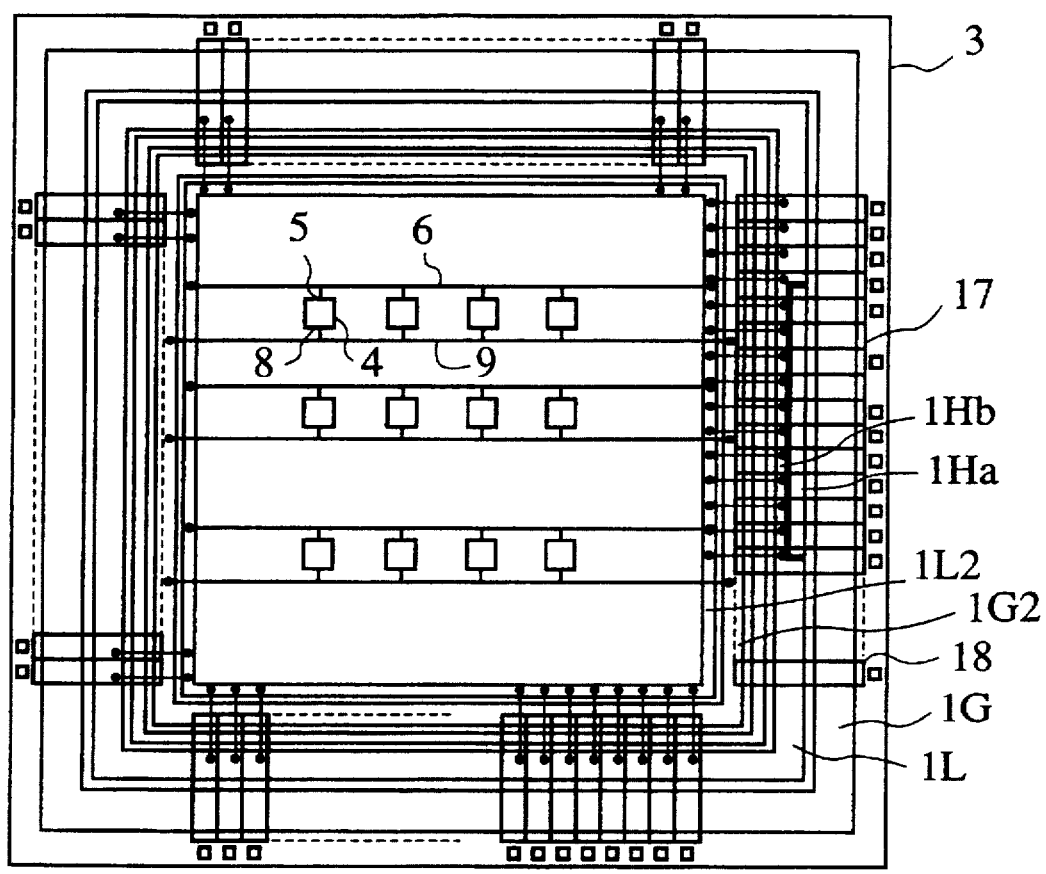
FIG. 7 is a plan view showing an overall structure of a semiconductor chip for a semiconductor integrated circuit according to a third embodiment of the present invention.

FIG. 7 is a plan view showing an overall structure of a semiconductor chip on which a semiconductor integrated circuit is formed, according to a third embodiment of the present invention. As shown in FIG. 7, this third embodiment is characterized with respect to the second embodiment of the present invention shown in FIG. 6 in that, in addition to a wide second power supply wiring 1H$a$ corresponding to the second power supply wiring 1H in the second embodiment, a group of fourth type cells having a second power supply wiring 1H$b$ which is narrow in comparison with the wide second power supply wiring 1H$a$ as the second level wiring layer are provided. Moreover, in the third embodiment, the narrow second power supply wiring 1H$b$ is provided to a group of cells 18 to thus form third type cells. The third type cell lacks the wide second power supply wiring 1H$a$. In the third embodiment of the present invention, output stage transistors having large current driving capability in the output buffer receive the second power supply voltage via the wide second power supply wiring 1H$a$, while other transistors in the output buffer and all transistors in the input buffer receive the power supply voltage via the narrow second power supply wiring 1H$b$. Furthermore, in the third embodiment of the present invention, a second reference power supply wiring 1G2 is provided as shown in FIG. 7 to supply the reference voltage to all cells. A narrow first power supply wiring 1L2 is disposed, to deliver the first power supply voltage, between the internal circuits 4 and peripheral cell array. Each internal circuit 4 has a first and second terminals 5, 8. The first terminal 5 is connected to an internal power supply wiring 6. The second terminal 8 is connected to an internal reference wiring 9. The second reference power supply wiring 1G2 is connected to the internal reference wirings 9 and the narrow first power supply wiring 1L2 is connected to the internal power supply wirings 6.

In the first embodiment of the present invention shown in FIG. 5 and the second embodiment of the present invention, all the cells which use the second power supply voltage are subject to restrictions on arrangement. Mainly output transistors at the final stage in the output buffer for outputting signal to the outside of the semiconductor chip dissipate high current and need wide wirings. For transistors in the input buffer and transistors in the output buffer other than the final stage, operating with smaller current, power supply wirings which are narrower than those for the output transistors at the final stage may be used sufficiently. Therefore, in the third embodiment of the present invention, the second power supply wirings for supplying the second power supply voltage to the second type I/O cells in the first and second embodiments are divided into the wide and narrow second power supply wiring 1H$a$, 1H$b$. The wide second power supply wiring 1H$a$ is connected to the output transistors at the final stage in the output buffer and the narrow second power supply wiring 1H$b$ is connected to the remaining transistors, thereby forming fourth type cells.

Another second power supply wiring 1H$b$ which has a same shape as the second power supply wiring 1H$b$ formed on the fourth type cells 17 is formed on the third type cells 18 as the second level wiring layer. The third type cell comprises the same kind power supply wirings, geometrically connected by the wirings having same width and location, formed as the second level wiring layer on the adjacent cells.

As a result, except for the cells in the output buffers, cells which do not need a large current may be formed as the third type cells, which have substantially the geometrical configuration of both the first and second type cells in the first and second embodiments, even if such cells use the second power supply voltage. Hence, such restrictions can be eased by using the third and fourth type cells properly that the second type input buffers cannot be arranged in the first type cell region in the first and second embodiments.

In the above first to third embodiments, the integrated circuit having first and second level wiring layers are explained as examples. For the case that more than three level wiring layers are employed, it is natural that the power supply wiring may be disposed on any upper level layer than the second level wiring layer.

Various modifications will become possible for those skilled in the art after receiving the teachings of the present disclosure without departing from the scope thereof.

What is claimed is:

1. A semiconductor integrated circuit having a cell array including I/O cells and power supply cells, formed on a peripheral regions on a semiconductor chip, the cell array comprising:
    (a) first type cells having, as a second level wiring layer, a reference power supply voltage wiring for supplying a reference voltage, and a first power supply wiring for supplying a first power supply voltage; and
    (b) second type cells having, as the second level wiring layer, the reference power supply voltage wiring, the first power supply wiring, and a second power supply wiring for supplying a second power supply voltage;
    wherein the second type cells are arranged in a predetermined area collectively.

2. The circuit of claim 1, wherein the first type cells include input buffers and output buffers which are operated by the reference power supply voltage and the first power supply voltage.

3. The circuit of claim 1, wherein the first type cells include,
    reference power supply cells through which the reference power supply voltage is supplied to the I/O cells, and first power supply cells through which the first power supply voltage is supplied to the I/O cells.

4. The circuit of claim 1, wherein the second type cells include, first input buffers operated with the reference power supply voltage and the first power supply voltage, and second input buffers and output buffers operated with the reference power supply voltage, the first and the second power supply voltages.

5. The circuit of claim 1, wherein the second type cells include, reference power supply cells through which the reference voltage is supplied to the I/O cells, first power supply cells through which the first power supply voltage is supplied to the I/O cells, and second power supply cells through which the second power supply voltage is supplied to the I/O cells.

6. The circuit of claim 1, wherein the first power supply wiring is formed to be partially narrowed generating a vacant space, and the second power supply wiring is formed to fill the vacant space, electrically isolated with the first power supply wiring.

7. The circuit of claim 1, further comprising a plurality of internal circuits arranged on a central region of the semiconductor chip so as to be surrounded by the cell array.

8. The circuit of claim 7, further comprising a second reference power supply wiring formed between the plurality of internal circuits and the cell array.

9. The circuit of claim 8, wherein the plurality of internal circuits are connected to internal power supply wiring and internal reference wiring respectively, the internal power supply wiring is connected to the first power supply wiring, and the internal reference wiring is connected to the second reference power supply wiring.

10. The circuit of claim 1, further comprising boundary connection cell arranged between the first and the second type cells to connect adjacent reference power supply wirings with each other and to connect adjacent first power supply wirings with each other.

11. The circuit of claim 1, wherein the first type cells further comprises intercell connection cells which are arranged in areas where the I/O cells and the power supply cells are not formed, to connect adjacent second wiring layers with each other.

12. The circuit of claim 1, wherein the second type cells further comprises intercell connection cells which are arranged in areas where the I/O cells and the power supply cells are not formed, to connect adjacent second wiring layers with each other.

13. The circuit of claim 10, wherein the boundary connection cell is a power supply cell.

14. A semiconductor integrated circuit having a cell array including I/O cells and power supply cells, formed on a peripheral regions on a semiconductor chip, the cell array comprising:

(a) third type cells having, as a second level wiring layer, at least one reference power supply wiring for supplying a reference voltage, at least one first power supply wiring for supplying a first power supply voltage, and at least one second power supply wiring for supplying a second power supply voltage; and (b) fourth type cells having, as the second level wiring layer, the at least one reference power supply voltage wiring, the at least one first power supply wiring, and second power supply wirings for supplying the second power supply voltage, the second power supply wirings being larger than the second power supply wiring in the third type cells in number.

15. The circuit of claim 14, wherein at least two of the second power supply wirings in the fourth type cells have different wiring widths from each other.

16. The circuit of claim 14, further comprising a plurality of internal circuits arranged on a central region of the semiconductor chip so as to be surrounded by the cell array.

17. The circuit of claim 16, wherein a narrow first power supply wiring which is arranged to surround the plurality of internal circuits.

18. The circuit of claim 17, wherein the second level wiring layer in the fourth type cells are composed of a first reference power supply wiring, a second reference power supply wiring, a wide first power supply wiring, a second narrow power supply wiring, and a wide second power supply wiring, the second reference power supply wiring, the narrow second power supply wiring, the wide first power supply wiring, and the first reference power supply wiring are arranged in sequence on the outer periphery side of the narrow first power supply wiring, and a part of the wide first power supply wiring is formed to be partially narrowed generating a vacant space, and the wide second power supply wiring is formed to fill the vacant space, electrically isolated with the wide first power supply wiring.

19. The circuit of claim 18, wherein the plurality of internal circuits are connected to internal power supply wiring and internal reference wiring respectively, the internal power supply wiring is connected to the narrow first power supply wiring, and the internal reference wiring is connected to the second reference power supply wiring.

* * * * *